United States Patent
Miguelanez et al.

(10) Patent No.: US 8,788,237 B2
(45) Date of Patent: *Jul. 22, 2014

(54) METHODS AND APPARATUS FOR HYBRID OUTLIER DETECTION

(71) Applicant: Test Acuity Solutions, Tempe, AZ (US)

(72) Inventors: Emilio Miguelanez, Edinburgh (GB); Greg LaBonte, Phoenix, AZ (US)

(73) Assignee: Test Acuity Solutions, Scottsdale, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/853,686

(22) Filed: Mar. 29, 2013

(65) Prior Publication Data

US 2013/0226491 A1  Aug. 29, 2013

Related U.S. Application Data (63) Continuation-in-part of application No. 11/134,843, filed on May 20, 2005, now Pat. No. 8,417,477, which is a continuation-in-part of application No. 10/817,750, filed on Apr. 2, 2004, now Pat. No. 7,395,170, which is a continuation-in-part of application No. 10/730,388, filed on Dec. 7, 2003, now Pat. No. 7,225,107, which is a continuation-in-part of application No. 10/367,355, filed on Feb. 14, 2003, now Pat. No. 7,167,811, which is a continuation-in-part of application No. 10/154,627, filed on May 24, 2002, now Pat. No. 6,792,373, application No. 13/853,686, which is a continuation of application No. 11/535,851, filed on Sep. 27, 2006, now abandoned, and a continuation of application No. 12/579,634, filed on Oct. 15, 2009, now Pat. No. 8,606,536.

(51) Int. Cl.
*G01R 27/28* (2006.01)

(52) U.S. Cl.
USPC ............................................. 702/118

(58) Field of Classification Search
None
See application file for complete search history.

(56) References Cited

U.S. PATENT DOCUMENTS

| | | | |
|---|---|---|---|
| 2003/0014205 A1* | 1/2003 | Tabor | 702/84 |
| 2003/0144810 A1* | 7/2003 | Tabor | 702/108 |

* cited by examiner

*Primary Examiner* — Aditya Bhat
(74) *Attorney, Agent, or Firm* — The Noblitt Group, PLLC (57) ABSTRACT

Methods and apparatus for data analysis according to various aspects of the present invention are configured to identify statistical outliers in test data for components, including hybrid outliers representing outliers within subsets of larger data populations. A method and apparatus according to various aspects of the present invention may operate in conjunction with a test system having a tester, such as automatic test equipment (ATE) for testing semiconductors.

21 Claims, 8 Drawing Sheets

METHODS AND APPARATUS FOR HYBRID OUTLIER DETECTION

CROSS-REFERENCES TO RELATED APPLICATIONS

This application is a continuation-in-part ("CIP") of U.S. patent application Ser. No. 11/134,843, filed on May 20, 2005, which is a CIP of U.S. Ser. No. 10/817,750, now U.S. Pat. No. 7,395,170, filed on Apr. 2, 2004, which is a CIP of U.S. Ser. No. 10/730,388, now U.S. Pat. No. 7,225,107, filed on Dec. 7, 2003, which is a CIP of U.S. Ser. No. 10/367,355, now U.S. Pat. No. 7,167,811, filed on Feb. 14, 2003, which is a CIP of U.S. Ser. No. 10/154,627, now U.S. Pat. No. 6,792,373, filed on May 24, 2002, and incorporates the disclosure of such applications by reference. This application is also a continuation of U.S. patent application Ser. No. 11/535,851, filed on Sep. 27, 2006, which is a CIP of U.S. patent application Ser. No. 11/134,843, filed on May 20, 2005, which is a CIP of U.S. Ser. No. 10/817,750, now U.S. Pat. No. 7,395,170, filed on Apr. 2, 2004, which is a CIP of U.S. Ser. No. 10/730,388, now U.S. Pat. No. 7,225,107, filed on Dec. 7, 2003, which is a CIP of U.S. Ser. No. 10/367,355, now U.S. Pat. No. 7,167,811, filed on Feb. 14, 2003, which is a CIP of U.S. Ser. No. 10/154,627, now U.S. Pat. No. 6,792,373, filed on May 24, 2002, and incorporates the disclosure of such applications by reference. This application is also a continuation of U.S. patent application Ser. No. 12/579,634, filed Oct. 15, 2009, which is a continuation of U.S. patent application Ser. No. 11/535,851, filed on Sep. 27, 2006, which, is a CIP of U.S. patent application Ser. No. 11/134,843, filed on May 20, 2005, which is a CIP of U.S. Ser. No. 10/817,750, now U.S. Pat. No. 7,395,170, filed on Apr. 2, 2004, which is a CIP of U.S. Ser. No. 10/730,388, now U.S. Pat. No. 7,225,107, filed on Dec. 7, 2003, which is a CIP of U.S. Ser. No. 10/367,355, now U.S. Pat. No. 7,167,811, filed on Feb. 14, 2003, which is a CIP of U.S. Ser. No. 50/154,627, now U.S. Pat. No. 6,792,373, filed on May 24, 2002, and incorporates the disclosure of such applications by reference. To the extent that the present disclosure conflicts with any referenced application, however, the present disclosure is to be given priority.

BACKGROUND OF THE INVENTION

Semiconductor companies test components to ensure that the components operate properly. The test data not only determine whether the components function as intended, but also may indicate deficiencies in the manufacturing process. Accordingly, many semiconductor companies analyze the collected data from several different components to identify and correct problems. For example, the company may gather test data for multiple chips on each wafer among several different lots. Test data may come from a variety of sources, such as parametric electrical testing, optical inspection, scanning electron microscopy, energy dispersive x-ray spectroscopy, and focused ion beam processes for defect analysis and fault isolation. This data may be analyzed to identify common deficiencies or patterns of defects or identify parts that may exhibit quality and performance issues and to identify or classify user-defined "good parts". Steps may then be taken to correct the problems. Testing is typically performed before device packaging (at wafer level) as well as upon completion of assembly (final test).

Gathering and analyzing test data is expensive and time consuming. Automatic testers apply signals to the components and read the corresponding output signals. The output signals may be analyzed to determine whether the component is operating properly. Each tester generates a large volume of data. For example, each tester may perform 200 tests on a single component, and each of those tests may be repeated 10 times. Consequently, a test of a single component may yield 2000 results. Because each tester is testing 100 or more components an hour and several testers may be connected to the same server, the test process generates an enormous amount of data.

The analysis of the gathered data is also difficult. The volume of the data may demand significant processing power and time. As a result, the data is not usually analyzed at product run time, but is instead typically analyzed between test runs or in other batches. To alleviate some of these burdens, some companies only sample the data from the testers and discard the rest. Analyzing less than all of the data, however, ensures that the resulting analysis cannot be fully complete and accurate. As a result, sampling degrades the complete understanding of the test results.

In addition, even when the full set of test data generated by the tester is retained, the sheer volume of the test data presents difficulties in analyzing the data and extracting meaningful results. The data may contain significant information about the devices, the testing process, and the manufacturing process that may be used to improve production, reliability, and testing. In view of the amount of data, however, isolating and presenting the information to the user or another system is challenging.

BRIEF DESCRIPTION OF THE DRAWING

A more complete understanding of the present invention may be derived by referring to the detailed description and the claims when considered in connection with the following illustrative figures, which may not be to scale. Like reference numbers refer to similar elements throughout the figures.

Elements in the figures are illustrated for simplicity and clarity and have not necessarily been drawn to scale. For example, the connections and steps performed by some of the elements in the figures may be exaggerated or omitted relative to other elements to help to improve understanding of embodiments of the present invention.

DETAILED DESCRIPTION OF EXEMPLARY EMBODIMENTS

The present invention may be described in terms of functional block components and various process steps. Such functional blocks and steps may be realized by any number of hardware or software components configured to perform the specified functions. For example, the present invention may employ various testers, processors, storage systems, processes, and algorithms, including statistical engines, memory elements, signal processing elements, logic elements, proximity analysis engines, programs, and the like, which may carry out a variety of functions under the control of one or more testers, microprocessors, or other control devices. In addition, the present invention may be practiced in conjunction with any number of test environments, and each system described is merely one exemplary application for the invention. Further, the present invention may employ any number of conventional techniques for data analysis, component interlacing, data processing, component handling, and the like.

Figure 1:
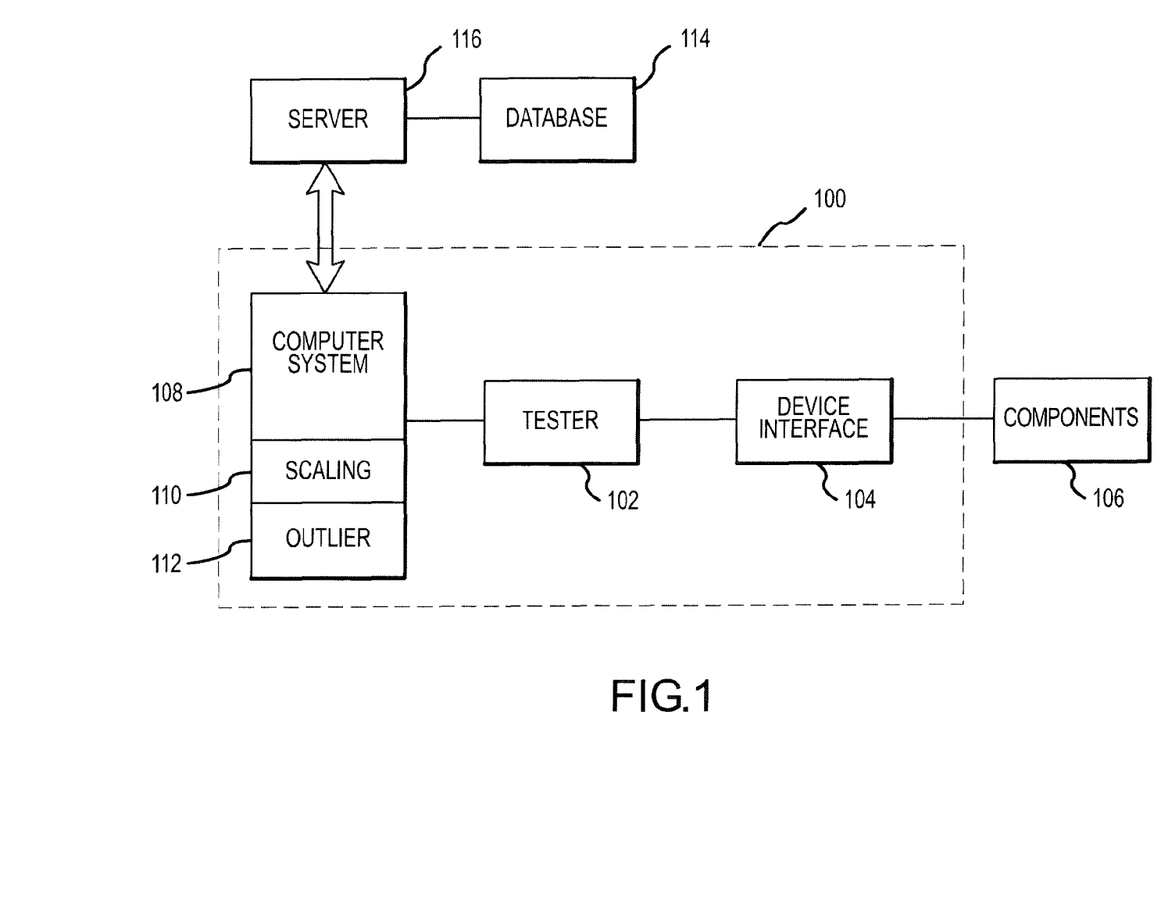
FIG. 1 is a block diagram of a test system according to various aspects of the present invention and associated functional components.

Referring to FIG. 1, a method and apparatus according to various aspects of the present invention operates in conjunction with a test system 100 having a tester 102, such as automatic test equipment (ATE) for testing semiconductors. In the present embodiment, the test system 100 comprises the tester 102 and a computer system 108. The test system 100 may be configured for testing any components 106, such as semiconductor devices on a wafer, circuit boards, packaged devices, or other electrical or optical systems. Various aspects of the present invention, however, may be applied to many environments having multiple data points, such as credit card fraud detection, athlete performance analysis, voting irregularity analysis, and severe weather prediction. In the present embodiment, the components 106 comprise multiple integrated circuit dies formed on a wafer or packaged integrated circuits or devices. The components 106 are created using a fabrication process, which may comprise any suitable manufacturing process for creating the components 106, and may include a test process, which may comprise any suitable process for testing the operation of the components 106.

The tester 102 suitably comprises any test equipment that tests components 106 and generates output data relating to the testing, and may comprise multiple machines or other sources of data. The tester 102 may comprise a conventional automatic tester and suitably operates in conjunction with other equipment for facilitating the testing. The tester 102 may be selected and configured according to the particular components 106 to be tested and/or any other appropriate criteria.

The tester 102 may operate in conjunction with the computer system 108 to, for example, program the tester 102, load and/or execute the test program, collect data, provide instructions to the tester 102, analyze test data, control tester parameters, and the like. In the present embodiment, the computer system 108 receives tester data from the tester 102 and performs various data analysis functions independently of the tester 102. The computer system 108 may comprise a separate computer having a processor and a memory, such as a personal computer or workstation, connected to or networked with the tester 102 to exchange signals with the tester 102. In an alternative embodiment, the computer system 108 may be omitted from or integrated into other components of the test system 100, and various functions may be performed by other components, such as the tester 102 or elements connected to the network.

The test system 100 may include additional equipment to facilitate testing of the components 106. For example, the present test system 100 includes a device interface 104, like a conventional device interface hoard and/or a device handler or prober, to handle the components 106 and provide an interface between the components 106 and the tester 102. The test system 100 may include or be connected to other components, equipment, software, and the like to facilitate testing of the components 106 according to the particular configuration, application, environment of the test system 100, or other relevant factors. For example, in the present embodiment, the test system 100 is connected to an appropriate communication medium, such as a local area network, intranet, or global network like the internet, to transmit information, to other systems, such as the remote server 116.

The test system 100 may include one or more testers 102 and one or more computers 108. Further, the computer 108 may be separate from the tester 102, or may be integrated into the tester 102, for example utilizing one or more processors, memories, clock circuits, and the like of the tester 102 itself. In addition, various functions may be performed by different computers.

A test system 100 according to various aspects of the present invention tests the components 106 and provides enhanced analysis and test results. For example, the enhanced analysis may identify incorrect, questionable, or unusual results. The test system 100 may also analyze multiple sets of data, such as data taken from multiple wafers and/or lots of wafers, to generate composite data based on multiple datasets. The operator, such as the product engineer, test engineer, manufacturing engineer, device engineer, or other personnel using the test data and analyses, may then use the results to verify and/or improve the test system 100 and/or the fabrication system and classify the components 106.

The test system 100 commences a test run, for example in conjunction with a conventional series of tests, in accordance with a test program. The tester 102 suitably executes the test program to apply signals to the components 106 and read output test data from the components 106. The tester 102 may perform multiple tests on each component 106 on a wafer or the wafer itself and each test may be repeated several times on the same component 106. The tests may comprise any appropriate tests, such as (but not limited to) continuity, supply current, leakage current, parametric static, parametric dynamic, and functional and stress tests. Test data from the tester 102 is stored for quick access and supplemental analysis as the test data is acquired. The data may also be stored in a long-term memory for subsequent analysis and use.

As the tester 102 generates the test results, the output test data for each component, test, and repetition is stored by the tester 102. The output test data received from each component 106 is analyzed by the tester 102 to classify the performance of the component 106, such as into a particular bin classification, for example by comparison to the upper and lower test limits, and the results of the classification are also stored in the tester data file. The tester data file may include additional information as well, such as logistics data and test program identification data. The tester data file is then provided to the computer 108 in an output file, such as a standard tester data format (STDF) file, and stored in memory. The tester data file may also be stored in the storage system for longer term storage for later analysis.

When the computer 108 receives the tester data file, it analyzes the data to provide enhanced output results. The computer 108 may provide any appropriate analysis of the tester data to achieve any suitable objective. For example, the computer 108 may implement a statistical engine for analyzing the output test data and identifying data and characteristics of the data of interest, at run time or later. The data and characteristics identified may be stored, while data that is not identified may be retained, discarded, or otherwise disposed.

Figure 2:
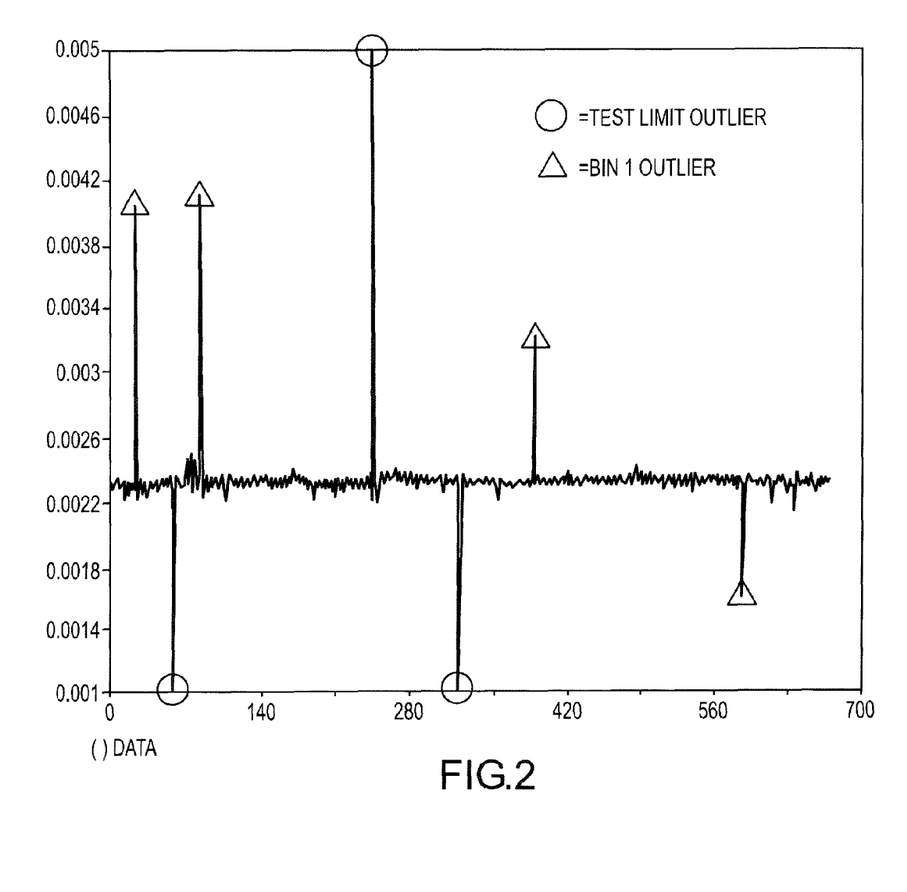
FIG. 2 is a plot of test data for a test of multiple components.

The computer 108 may perform additional analysis functions upon the generated, statistics and the output test data. Each test generates at least one result for at least one of the components. Referring to FIG. 2, an exemplary set of test results for a single test of multiple components comprises a first set of test results having statistically similar values and a second set of test results characterized by values that stray from the first set. Each test result may be compared to an upper test limit and a lower test limit. If a particular result for a component exceeds either limit, the component may be classified as a "bad part" or otherwise classified according to the test and/or the test result.

Some of the test results in the second set that stray from the first set may exceed the control limits, while others do not. For the present purposes, those test results that stray from the first set but do not exceed the control limits or otherwise fail to be detected are referred to as "outliers". The computer 108 may perform automatically identify and/or categorize the outliers in the test data. The outliers in the test results may be identified and analyzed for any appropriate purpose, such as to identify potentially unreliable components. The outliers may also be used to identify various potential problems and/or improvements in the test and manufacturing processes.

Analyzing each relevant datum according to one or more selected algorithms suitably identifies the outliers. If a particular algorithm is inappropriate for a set of data, the computer 108 may be configured to automatically select a different algorithm. The computer 108 may operate in any suitable manner to designate outliers, such as by comparison to preselected or dynamic values. For example, an outlier identification system according to various aspects of the present invention initially automatically calibrates its sensitivity to outliers based on selected statistical relationships for each relevant datum or other data. Some of these statistical relationships are then compared to a threshold or other reference point, such as the data mode, mean, or median, or combinations thereof, to define relative outlier threshold limits. In the present embodiment, the statistical relationships are scaled, for example by one, two, three, and six standard deviations of the data, to define the different outlier amplitudes. The output test data may then be compared to the outlier threshold limits to identify and categorize the output test data as outliers.

The computer 108 stores the resulting statistics and outliers in memory and identifiers, such as the x-y wafer map coordinates, associated with any such statistics and outliers. Selected statistics, outliers, and/or failures may also trigger notification events, such as sending an electronic message to an operator, triggering a light lower, stopping the tester 102, or notifying a server.

In the present embodiment, the computer 108 includes a scaling element 110 and an outlier classification engine 112. The scaling element 130 is configured to dynamically scale selected coefficients and other values according to the output test data. The outlier classification engine 112 is configured to identify and/or categorize the various outliers in the data according to selected algorithms.

More particularly, the scaling element 110 of the present embodiment suitably uses various statistical relationships for dynamically scaling outlier sensitivity. The scaling coefficients are suitably calculated by the sealing element and used to modify selected outlier sensitivity values. Any appropriate criteria, such as suitable statistical relationships, may be used for scaling.

The outlier classification engine 112 is suitably configured to identify and/or categorize the outliers in the components 106, output test data, and/or analysis results according to any suitable algorithms. In addition, the outlier classification engine 112 may be configured to utilize multiple candidate outlier identification algorithms and identify one or more algorithms suited for identifying outliers in the output test data. Different tests generate different population distributions, such that an outlier identification algorithm that is appropriate for one test may be inappropriate for another. The outlier classification engine 112 is suitably configured to differentiate between different data populations and automatically select one or more outlier identification algorithms based on the data population type of the current data. The automatic selection may select from any appropriate set of candidate outlier identification algorithms, and may perform the selection according to any suitable criteria and analysis.

Figure 3:
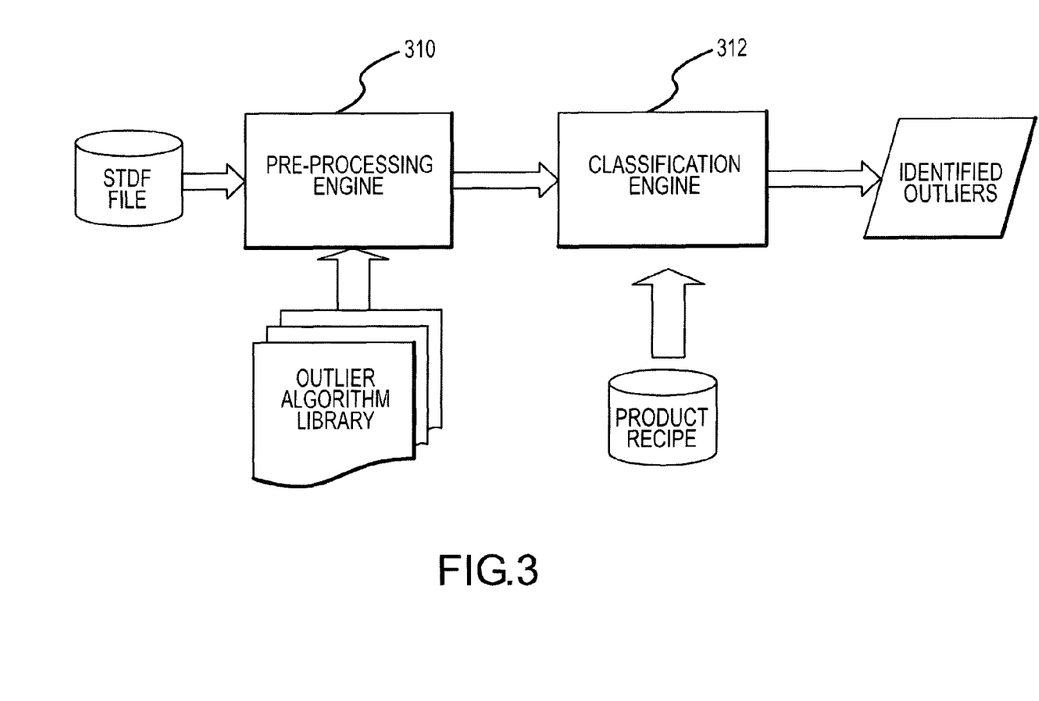
FIG. 3 is a diagram of a system for automatically selecting one or more outlier identification algorithms.

For example, referring to FIG. 3, the outlier classification engine 112 may be configured to automatically perform an outlier identification algorithm selection process. The outlier classification engine 112 suitably comprises a pre-processing engine 310 and a classification engine 312. The pre-processing engine 310 suitably generates data to facilitate selection of the relevant outlier identification algorithms. The classification engine 312 suitably selects one or more relevant outlier identification algorithms and identifies the outliers accordingly.

The output test data, for example data taken from a particular test, are initially provided to the outlier classification engine 112 to analyze the output test data for compatibility with various candidate outlier identification algorithms. The data may be analyzed in any suitable manner to identify appropriate algorithms for identifying the outliers in the output test data. For example, in the present embodiment, the pre-processing engine 310 receives the output test data and prepares the available outlier identification algorithms, such as by retrieving them from an outlier identification algorithm library stored in memory. The pre-processing engine 310 analyzes the output test data for outliers using several of the available algorithms. In the present embodiment, the pre-processing engine 310 analyzes the output test data using each of the algorithms designated, by the user, or another suitable selection of algorithms, to generate pre-processing data, such as outliers as identified by all algorithms and various descriptive statistics, such as minimum, maximum, mean, median, standard deviation, CPK, CPM, and the like.

The algorithms may be based on industry standard (e.g., IQR, median+/−N*sigma, etc.) and/or proprietary, custom, or user-defined outlier identification techniques. The outlier identification algorithm library is suitably configurable by the user, for example to add, remove, or edit outlier identification algorithms, for example according to the particular products under test or the characteristics of the tests to be performed. Different algorithms may be appropriate for different statistical population types, such as normal, logarithmic normal, bimodal, clamped, or low CPK data populations. The candidate outlier identification algorithms may comprise any suitable algorithms for various types and distributions of data, such as inter-quartile range (IQR) normal distribution, 3 sigma; IQR normal distribution, 6 sigma; IQR log normal, 3 sigma; IQR log normal, 6 sigma; bimodal algorithms; clamped algorithms; low capability algorithms; custom algorithms based on 3-, 6-, or n-sigma; and proprietary algorithms having various sensitivities. The pre-processing engine 310 may also analyze the test data to generate characteristics relating to the output test data. For example, the pre-processing engine 310 may calculate various statistical properties of the output test data.

The pre-processing algorithm results are suitably dynamically selected for outlier detection. In the present embodiment the outlier classification engine 112 analyzes the test results to identify the most useful or applicable outlier identification algorithms. The data from the selected outlier identification algorithms may be retained, while the remaining data is discarded. For example, in the present embodiment, the classification engine 312 receives the results of the pre-processing analysis generated by each of the available outlier identification algorithms. The classification engine 312 analyzes the pre-processing data according to any suitable criteria, such as predetermined and/or user-defined recipe-driven rules to determine whether the pre-processing data satisfy various criteria.

The rules may be any appropriate rules, for example employing statistical ratios or values, such as comparing statistics, like minimum, maximum, mean, median, standard deviation, CPK, and CPM, to various thresholds or other criteria. For example, the classification engine 312 may skip the outlier detection process under certain circumstances, such as having too few test results or a too narrow or a bimodal distribution among the test results. The rules may be pre-selected and/or may be adjusted or added by the user to accommodate specific conditions of the products and test environment. Further, the classification engine 312 may be configured to apply a particular algorithm to a certain type of test, for example when the results of the test are known to have a particular distribution. Other rules may determine whether a particular test is applicable. For example, the classification engine 312 may compare the CPK to a threshold. If the CPK is below the threshold, then the IQR normal outlier identification algorithm may be used. In the present system, results from an algorithm satisfying a rule are used for outlier identification. Other algorithm results for that test are suitably ignored.

The outlier classification engine 112 may also identify and categorize selected outliers and components 106 according to the output test results and the information generated by the computer 108. For example, the outlier classification engine 112 is suitably configured to categorize the components 106 into multiple categories, such as critical/marginal/good part categories, for example in conjunction with user-defined criteria; user-defined good/bad spatial patterns recognition; classification of pertinent data for tester data compression; test setup in-situ sensitivity qualifications and analysis; tester yield leveling analysis; dynamic wafer map and/or test strip mapping for part dispositions and dynamic retest; or test program optimization analyses. The outlier classification engine 112 may classify data in accordance with conventional SPC control rules, such as Western Electric rules or Nelson rules, to characterize the data.

The outlier classification engine 112 suitably categorizes the data using a selected set of classification limit calculation methods. Any appropriate classification methods may be used to characterize the data according to the needs of the operator. The present outlier classification engine 112, for example, categorizes outliers by comparing the output test data to selected thresholds, such as values corresponding to one, two, three, and six statistically scaled standard deviations from a threshold, such as the data mean, mode, and/or median. The identification of outliers in this manner tends to normalize any identified outliers for any test regardless of datum, amplitude and relative noise.

The outlier classification engine 112 analyzes and correlates the normalized outliers and/or the raw data points based on user-defined rules. The outlier classification engine 112 suitably performs the categorization according to each test, which may be performed independently of data from other tests or in conjunction with such data from other tests. Any suitable criteria may be used for categorizing the components based on test failures and outliers, such as;

FAIL if the part fails at least one test.

CRITICAL if at least one test has been identified to have a LARGE outlier or at least two MEDIUM outliers on two different tests for the otherwise passing part.

MARGINAL if at least one test has been identified to have a MEDIUM outlier or at least four SMALL outliers on four different tests for the otherwise passing part.

SMALL if at least one test has been identified to have a SMALL outlier for the otherwise passing part.

PASS without any SMALL, MEDIUM, or LARGE outlier for the otherwise passing part.

Criteria for small, medium, and large outliers may be selected according to any suitable criteria, such as thresholds based on the test limits and/or characteristics of the data.

Figure 4:
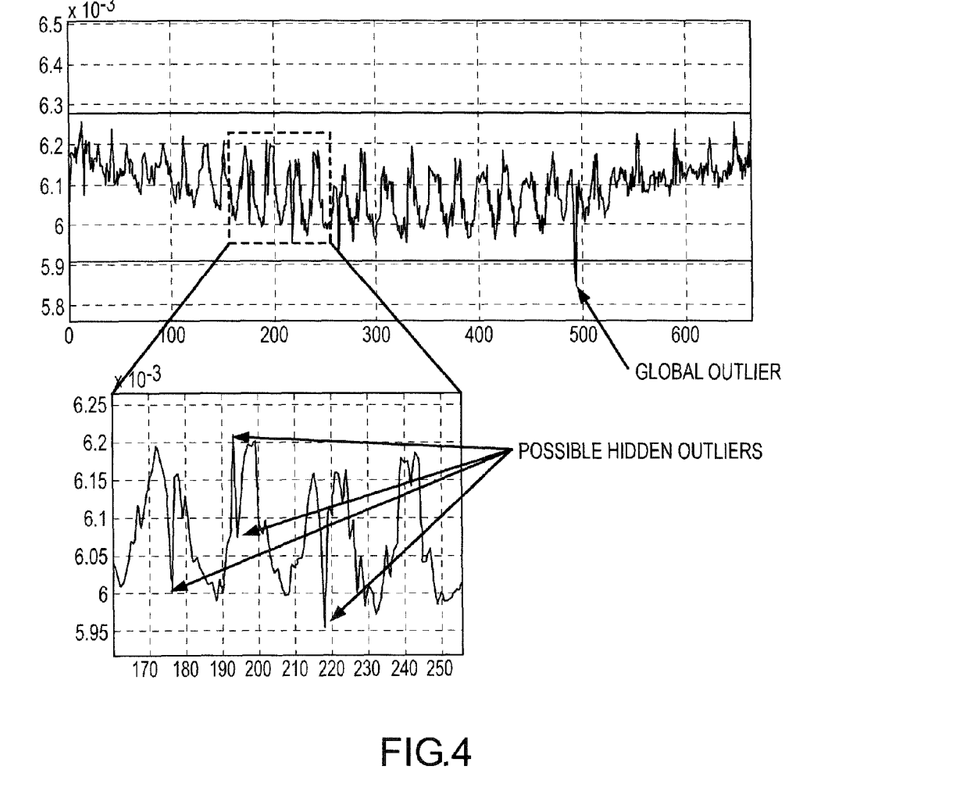
FIG. 4 is a plot of test data having global outliers and hybrid outliers.

The outlier classification engine 112 may also include a hybrid outlier system configured to identify hybrid outliers, also referred to as local outliers or hidden outliers, in the data. Hybrid outliers are inconsistent data points within a local group of data, but do not cross the thresholds defining the "global" outlier boundaries of the main population. Referring to FIG. 4, a global outlier lies outside the data distribution of the main data population. Hybrid outliers, however, do not lie outside the data distribution of the main data population, but may deviate significantly from a smaller local population of data points, such as a temporally or spatially local population.

Figure 5:
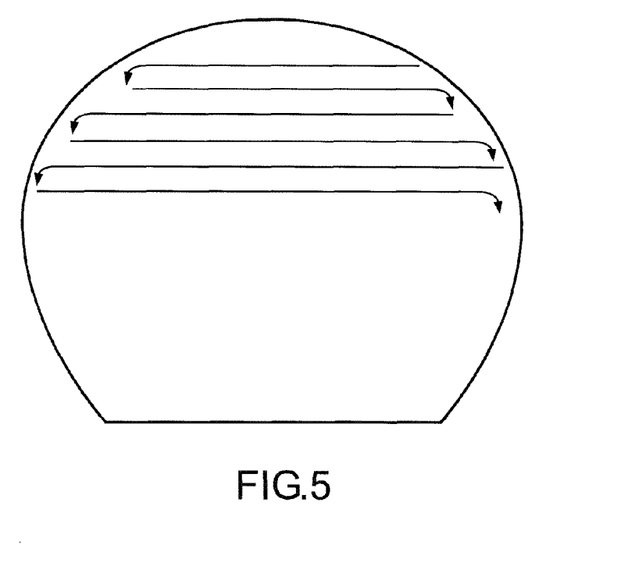
FIG. 5 is a diagram of a wafer and a sample path followed by a test prober over the wafer.
Figure 6:
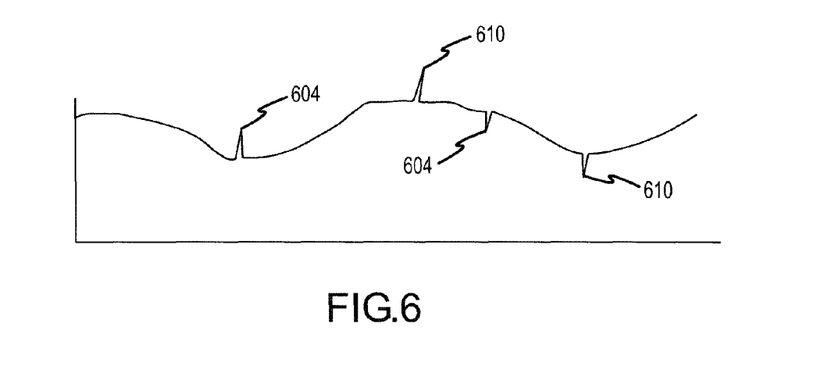
FIG. 6 is a diagram of variations of test data as the prober follows the path.

For example, referring to FIG. 5, the tester generates data by testing various components on the wafer sequentially. The tester moves the prober from component to component, accumulating test data for each component. Due to variations in the manufacturing process and materials and the testing process, the test data may vary regularly as the prober traverses the wafer (FIG. 6). Data points 610 lying well outside the variations for the wafer or for multiple wafers are ordinarily classified as global outliers. Data points 604 within or slightly beyond the variations ordinarily escape classification as global outliers, even if the data points 604 significantly differ from the data points for spatially nearby or corresponding components.

Hybrid outliers are suitably identified by analyzing individual raw, normalized, or otherwise processed data points with respect to proximate data points. The outlier classification engine 112 may apply a proximity analysis by comparing parametric or other data for individual components to hybrid outlier thresholds calculated using data for spatially related components. The proximity analysis may also be weighted, for example according to the distance between a central component and a nearby component. Proximity analysis may be performed by any appropriate system, such as a dedicated proximity analysis engine or a proximity analysis engine associated with another task, like a proximity analysis engine used for generating composite representations based on multiple datasets.

In one embodiment, as parametric data is processed, the outlier classification engine 112 may calculate hybrid outlier thresholds for a local data set, such as a selected number of most recently generated data. The data to be analyzed may comprise any suitable data, such as preceding data points, subsequent data points, both preceding and subsequent data points, temporally related data points, or spatially related data points. In addition, the number of data points in the local data set may be selected according to any suitable criteria, such as using a pre-selected number of data points or selecting the number of data points according to various criteria, such as the variability or noisiness of the data. If the data is noisy, the number of data points may be automatically adjusted, for example by increasing the number of data points in the local data set to reduce the effects of the noise. The hybrid outlier thresholds may be dynamically re-calculated with accumulation of new parametric data, for example by using a first-in, first-out (FIFO) calculation. The parametric data for the components in the area may then be compared to the thresholds to identify hybrid outliers.

The outlier classification engine 112 may be configured to identify the hybrid outliers 604 according to any suitable mechanism or process. In the present embodiment, the hybrid outliers 604 are identified in conjunction with an in-line process, i.e., performed automatically via a process that receives the data as it is generated or after testing is complete and the data stored and automatically provides the results without operator intervention or other action. Alternatively, the hybrid outliers 604 may be identified at run time or after the analysis is completed and the data stored. The outlier classification engine 112 may be integrated into the test program executed by the tester 102. The test data may comprise any type of test data, such as bin results or parametric testing data. Further, the data may be pre-processed, such as by removing global outliers and/or data for components classified as failures, or normalizing data across various sections of the wafer, such as sections associated with multisite testing or stepper fields.

Figure 7:
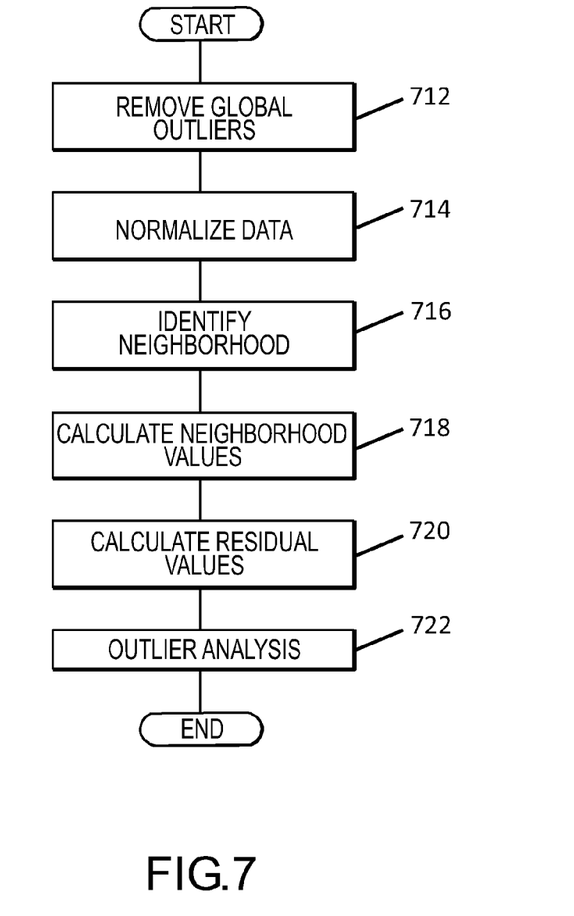
FIG. 7 is a flow diagram for identifying hybrid outliers.

Referring to FIG. 7, in the present embodiment, the outlier classification engine 112 or other outlier identification system initially filters out global outliers from the data and processes the remaining data to identify hybrid outliers (710). The outlier classification engine 112 may further process the filtered data, for example to normalize the data in view of known sources of variation (712). The outlier classification engine 112 may then identify hybrid outliers according to any suitable technique or criteria. For example, the outlier classification engine 112 may select and/or adjust a window encompassing a selected number and geometry of components to identify spatially related components (714). The outlier classification engine 112 may then determine a neighborhood value for the component corresponding to the test data for the components in the neighborhood (716). The test data for the component may then be analyzed relative to the neighborhood value to identify hybrid outliers.

In particular, the data may be normalized, which comprises adjusting data values to correct for differences in data that may be generated due to known causes that negatively impact the consistency of the data. In the present embodiment, the hybrid outlier system normalizes the test data for each component relative to test data for all other components on the wafer to facilitate comparison. For example, if the test data was generated using multi-site testing in which multiple resources test wafers or components simultaneously, variations in the data may be induced due to disparities in the resources. For multi-site testing, the data may be analyzed for hybrid outliers for all sites, for each site independently, and/or for all normalized sites.

The data may be normalized in any suitable manner, such as to address known sources of variation. Components sharing a known common source of inconsistency may be normalized using the same normalization criteria. For example, in the present embodiment, parametric test data generated in conjunction with a multi-site testing environment may be normalized according to the following equation:

$$\text{norm\_site}_n = \frac{\text{data\_site}_n - \text{median\_site}_n}{\text{iqr\_site}_n}$$

where for the site n, $\text{norm\_site}_n$ is the resulting normalized data, $\text{data\_site}_n$ is the pre-normalized data, $\text{median\_site}_n$ is the statistic median and $\text{iqr\_site}_n$ is the interquartile range for the site analyzed. The normalized data may be stored in any suitable manner, for example on a normalized data device map having the normalized data for each device.

To detect hybrid outliers, the outlier classification engine 112 analyzes local data, such as data for spatially near components. For example, the outlier classification engine 112 may detect hybrid outliers according to the geometry of the wafer. The hybrid outliers may be identified according to any suitable technique or process. In the present embodiment, the outlier classification engine 112 analyzes the data for nearby components.

In one embodiment, the computer 108 may perform a proximity analysis for each component on the wafer. For example, the computer 108 may be configured to identify hybrid outliers by identifying outliers within subsets of the overall dataset, such as within data for a selected group of components on a particular wafer. In one embodiment, referring to FIG. 8, the computer 108 may establish a pattern or window 810 of a selected size that may be used to select multiple components on a wafer 812. The pattern or window 810 comprises a perimeter defining a spatial area of interest, such as a subset of the components on the wafer 812. The size of the window 810 may be selected or adjusted according to any suitable criteria, such as the number of components proximate the central component, the type of test or component, or the desired sensitivity of the outlier analysis. The shape of the window may likewise be selected according to any appropriate criteria, such as the spatial area of interest. For example, if the area of interest does not facilitate the use of a rectangular window, such as near the curved edges of the wafer 812, an alternative shape may be selected for the window 810 to accommodate the relevant area of the wafer 812.

Figure 9:
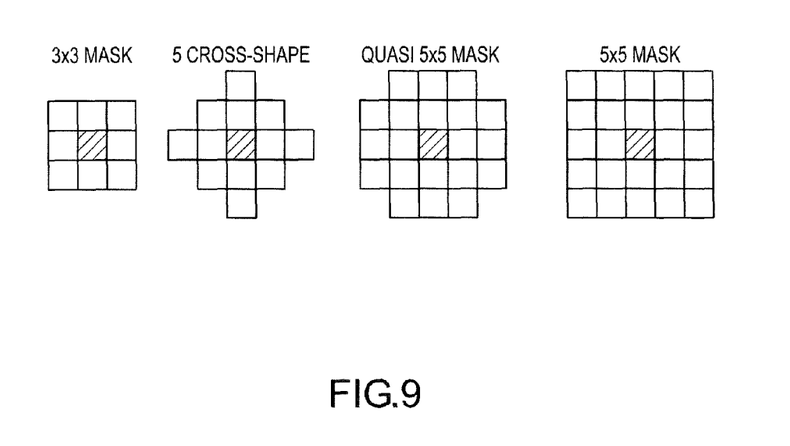
FIG. 9 is a diagram of potential filter types for proximity analysis.

Referring to FIG. 9, in one embodiment, the outlier classification engine 112 may employ one or more predetermined windows or masks that may be applied to each component in the data set to establish the relevant window. The size and shape of the windows may be selected according to any suitable criteria, such as according to a pre-selected type, an operator designation, or an automatic selection process. The user can pre-define the type and size of the window to be used or the outlier classification engine 112 can automatically adapt the window shape and/or size according to the nature of the area surrounding the relevant component, such as for locations near the edge of the wafer, possible sampling factors, empty spaces on the wafer or missing data, and the like.

In the present embodiment, the outlier classification engine 112 requires a selected amount of data, such as data for at least four to eight surrounding components, such as five, to perform the analysis. In one embodiment, the devices only count towards the minimum if they satisfy one or more selected criteria, such as being classified as passing or "good" devices. If the initial area within the window has fewer than five other "good" devices, the outlier classification engine 112 may adjust increase the size and/or shape of the window or pattern until the number of components meets the required number. In one embodiment, the outlier classification engine 112 adjusts the window or pattern by applying a predetermined sequence of patterns, in which the sequence comprises patterns of increasing size. In addition, the outlier classification engine 112 may abort the analysts if a minimum number of acceptable data is not available. For example, the outlier classification engine 112 may only perform the analysis and/or adjust the size and/or shape of the window if the device under study has at least five "bin 1" devices in the initial window. Thus, data for a particular device may be categorized as a hybrid outlier only if there are sufficient data for neighboring components in the initial window. In other embodiments, substitute data may be used. For example, the missing data may be replaced with idealized data representing ideal values for such components, or with data based on other components on the wafer, such as components in surrounding bands around the missing data or components in corresponding positions on other wafers in the lot.

Figure 8:
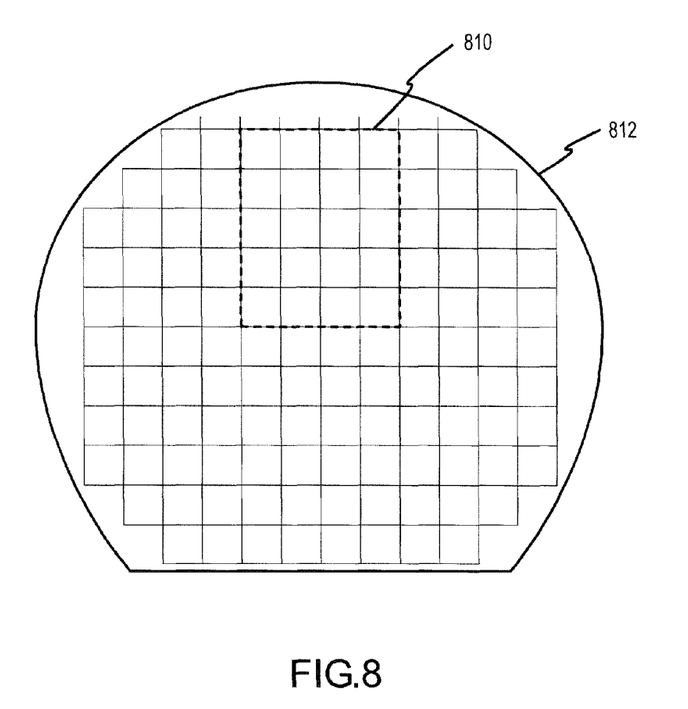
FIG. 8 is a diagram of a wafer and a spatial analysis window.

The window 810 is then applied to various areas of the wafer 812, and hybrid outliers are identified among the data for components within the window 810. The outlier classification engine 112 may identity the hybrid outliers according to any appropriate criteria and technique. For example, the outlier classification engine 112 may initially analyze a starting component, such as a component at the left end of the top row of the wafer, and sequentially analyze data for each component on the wafer. The outlier classification engine 112 may adjust the size and shape of the window as each component is analyzed. Data for the components within the window are then retrieved, from memory and analyzed for outliers, for example using only the data for components within the window.

The area within the window may be characterized and/or analyzed according to any suitable criteria or technique. For example, the outlier classification engine 112 may calculate one or more representative neighborhood values for each component based on the data for the surrounding components. A window is applied to each component to generate a neighborhood value for each component for the relevant test. The data for each component may then be analyzed and/or compared to the corresponding neighborhood value to identify hybrid outliers.

In the present embodiment, as the window is applied to each component, the outlier classification engine 112 calculates a neighborhood value for the window corresponding to a derived value derived from values for the components in the neighborhood. For example, the derived value may comprise an average value representing a central value for multiple values, such as an arithmetic mean, statistic median, mode, geometric mean, weighted mean, and the like. The present outlier classification engine 112 employs the median value as the neighborhood value, as the median may often operate as a robust estimator of the center of the local neighborhood. The median value is then stored, for example on a neighborhood value device map storing the neighborhood value calculated for each device. The outlier classification engine 112 moves the window to the next component. In addition, the outlier classification engine 112 may apply different weights to the data of surrounding components, such as according to the proximity of a device to the central device. For example, data for components closer to the central component may have greater affect in calculating the neighborhood value than data for components that are farther away.

Hybrid outliers may be identified by analyzing the data for each component in view of the corresponding neighborhood values. Any suitable outlier detection system or approach may be used to identify the hybrid outliers. For example, the outlier classification engine 112 may calculate a unique hybrid outlier threshold based on the neighborhood value for each component and compare the raw data to the calculated threshold. Alternatively, the outlier classification engine 112 may generate a value based on the raw data and the neighborhood value for each component and compare the value to a threshold or the like. Locations of identified hybrid outliers are stored, along with any other relevant information.

In the present embodiment, referring again to FIG. 7, the outlier classification engine 112 generates a residual value for each component according to the raw data and the unique neighborhood values (718) and applies conventional outlier identification techniques to the residuals to identify hybrid outliers (720). The residual component may be determined according to any suitable criteria or technique. In the present embodiment, residuals are calculated using the following equation:

$$\mathrm{residual} = \frac{data_{norm} - data_{smooth}}{RMSE}$$

where $data_{norm}$ is the normalized raw test data value, $data_{smooth}$ is the relevant neighborhood value, and RMSE defines the square root of the mean square error of values for all relevant points, such as for all devices on the wafer. In the present embodiment, RMSE is the root mean square of the sum of the differences between the normalized and smoothed data for each device on the wafer. This equation produces a standardized error, which is approximately a normal distribution with mean 0 and variance of 1.

The resulting residual data may be stored, for example in a residual data device map storing residual data values for each device. Outlier detection techniques may be applied to the residual values for the various components to identify outliers. For example, the outlier classification engine 112 may calculate control limits based on the residual values, and the residual values exceeding the limits may be identified as hybrid outliers. For example, the outlier classification engine 112 may analyze the residual data according to one or more outlier identification algorithms to identify outliers in the residual data. The corresponding devices may then be designated as outliers for the relevant test.

The outlier classification engine 112 may also be configured to perform additional analysis of the hybrid outlier data (722). For example, the outlier classification engine 112 may identify and categorize selected hybrid outliers and components 106, such as to categorize the components 106 into multiple categories as described previously regarding global outliers. In one embodiment the hybrid outliers are categorized as small, medium, or large hybrid outliers, for example in conjunction with user-defined criteria; user-defined spatial patterns recognition; categorization of pertinent data for tester data compression; test setup in-situ sensitivity qualifications and analysis; tester yield leveling analysis; dynamic wafer map and/or test strip mapping for part dispositions and dynamic retest; or test program optimization analyses.

The outlier classification engine 112 suitably classifies the hybrid outlier data using a selected set of classification limit calculation methods. Any appropriate classification methods may be used to characterize the hybrid outlier data according to the needs of the operator. The present outlier classification engine 112, for example, categorizes hybrid outliers by comparing the relevant test data or derived data to selected thresholds, such as values corresponding to one, two, three, and six statistically scaled standard deviations from a threshold, such as the test limits or a data mean, mode, and/or median for a relevant geographic area. The categorization of hybrid outliers in this manner tends to normalize any identified hybrid outliers for any test regardless of datum amplitude and relative noise. In one embodiment, the outlier classification engine 112 may categorize hybrid outliers according to the magnitude of the difference between the test data for the central component and the derived value for the plurality of local components. The categorization may be based directly on the difference or indirectly, such as according to a value based on or derived from the difference.

The outlier classification engine 112 analyzes and correlates the normalized hybrid outliers and/or the raw data points based on user-defined rules. The hybrid outlier classification engine 112 suitably performs the categorization according to each test, which, may be performed independently of data from other tests or in conjunction with such data front other tests. Criteria for small, medium, and large outliers may be selected according to any suitable criteria, such as thresholds based on the test limits and/or characteristics of the data.

In one embodiment, the outlier classification engine 112 may forego the hybrid outlier detection analysis or discard the results of such analysis if the results appear to be unlikely to yield useful information. For example, the outlier classification, engine 112 may compare the number of test data points for a particular test to a threshold, such as 20. If there are fewer than the threshold number of test data points for analysis, the outlier classification engine 112 may forego the hybrid outlier analysis. Similarly, if the number of hybrid outliers detected exceeds a threshold, such as 10, the hybrid outlier analysis results may be discarded as generating too many results to be considered hybrid outliers. Alternatively, the outlier classification engine 112 may perform and/or retain the results, but annotate the results to indicate the potentially suspect nature of the data.

The computer 108 collects data from the test system 100, suitably at run time or in conjunction with an in-line process, and provides an output report to a printer, database, operator interface, or other desired destination. Any form, such as graphical, numerical, textual, printed, or electronic form, may be used to present the output report for use or subsequent analysis. The computer 108 may provide any selected content, including selected output test data from the tester 102 and results of the supplementary data analysis.

In the present embodiment, the computer 108 suitably provides a selection of data from the output test data specified by the operator as well as supplemental data. The computer 108 may also be configured to include information relating to the outliers, or other information generated or identified by the supplementary data analysis element. If so configured, the identifiers, such as x-y coordinates, for each of the outliers are assembled as well. The coordinates for the operator-selected components and the outliers are merged into an output report, which in the current embodiment is in the format of the native tester data output format. Merging resulting data into the output report facilitates compression of the original data into summary statistics and critical raw data values into a smaller native tester data file, reducing data storage requirements without compromising data integrity for subsequent customer analysis.

The retrieved information is then suitably stored. The report may be prepared in any appropriate format or manner. In the present embodiment, the output report suitably includes a dynamic catalog having a wafer map indicating the selected components on the wafer and their categorization. Further, the computer 108 may superimpose wafer map data corresponding to outliers on the water map of the preselected components. Additionally, the output element may include only the outliers from the wafer map or batch as the sampled output. The output report may also include a series of graphical representations of the data to highlight the occurrence of outliers and correlations in the data.

The output report may be provided in any suitable manner, for example output to a local workstation, sent to a server, activation of an alarm, or any other appropriate manner. In one embodiment, the output report may be provided off-line such that the output does not affect the operation of the system or transfer to the main server. In this configuration, the computer 108 copies data files, performs the analysis, and generates results, for example for demonstration or verification purposes.

The particular implementations shown and described are merely illustrative of the invention and its best mode and are not intended to otherwise limit the scope of the present invention in any way. For the sake of brevity, conventional signal processing, data transmission, and other functional aspects of the systems (and components of the individual operating components of the systems) may not be described in detail. Furthermore, the connecting lines shown in the various figures are intended to represent exemplary functional relationships and/or physical couplings between the various elements. Many alternative or additional functional relationships or physical connections may be present in a practical system. The present invention has been described above with reference to a preferred embodiment. Changes and modifications may be made, however, without departing from the scope of the present invention. These and other changes or modifications are intended to be included within the scope of the present invention, as expressed in the following claims.

The invention claimed is:

1. A test data analysis system for analyzing test data for multiple components fabricated on a wafer, comprising:
   a memory configured to store the test data; and
   a computer having access to the memory capable of retrieving the test data from the memory, and comprising a hybrid outlier system capable of, for each of a plurality of test data for each of a plurality of components:
   selecting a central component from the plurality of components;
   selecting a plurality of local components in a local area near the central component;
   determining a derived value of the test data for the plurality of local components;
   comparing the test data for the central component to the derived value for the plurality of local components; and
   identifying whether the test data for the central component represents a hybrid outlier according to the comparison of the test data for the central component to the derived value for the plurality of local components.

2. A test data analysis system according to claim 1, wherein the hybrid outlier system is configured to normalize the test data for the central component and the local components.

3. A test data analysis system according to claim 2, wherein the hybrid outlier system is configured to compare the test data for the central component to the derived value for the plurality of test components by comparing the normalized test data for the central component to the derived value for the plurality of test components.

4. A test data analysis system according to claim 2, wherein the test data comprises test data generated using multi-site testing, and wherein the hybrid outlier system is configured to normalize the test data for the central component and the local components to counter an inconsistency induced by the multi-site testing.

5. A test data analysis system according to claim 1, wherein the computer comprises an outlier identification system communicatively linked with the hybrid outlier system, and wherein the outlier identification system is configured to remove a global outlier from the test data before the hybrid outlier system identifies whether the test data for the central component represents the hybrid outlier.

6. A test data analysis system according to claim 1, wherein the derived value comprises an average value for the plurality of local components.

7. A test data analysis system according to claim 1, wherein the hybrid outlier system is configured to select the plurality of local components according to a pattern, and wherein the hybrid outlier system is configured to automatically increase a size of the pattern until a minimum number of local components satisfying a selected criterion are within the pattern.

8. A computer-implemented method for analyzing test data, stored in a memory accessible by a computer, for multiple components fabricated on a wafer, comprising:
  selecting, by the computer, a central component from the multiple components;
  selecting, by the computer, a plurality of local components in a local area near the central component;
  retrieving, by the computer, the test data for the selected components from the memory;
  determining, by the computer, a derived value of the test data for the plurality of local components;
  comparing, by the computer, the test data for the central component to the derived value for the plurality of local components; and
  identifying, by the computer, whether the test data for the central component represents a hybrid outlier according to the comparison of the test data for the central component to the derived value for the plurality of local components.

9. A computer-implemented method for analyzing test data according to claim 8, further comprising normalizing, by the computer, the test data for the central component and the local components on the wafer.

10. A computer-implemented method for analyzing test data according to claim 9, wherein comparing the test data for the central component to the derived value for the plurality of test components comprises comparing the normalized test data for the central component to the derived value for the plurality of test components.

11. A computer-implemented method for analyzing test data according to claim 9, wherein: the test data comprises test data generated using multi-site testing; and normalizing the test data for the central component and the local components comprises normalizing the test data to counter an inconsistency induced by the multi-site testing.

12. A computer-implemented method for analyzing test data according to claim 8, wherein the derived value comprises an average value for the plurality of local components.

13. A computer-implemented method for analyzing test data according to claim 8, further comprising removing, by the computer, a global outlier from the test data before identifying whether the test data for the central component represents the hybrid outlier.

14. A computer-implemented method for analyzing test data according to claim 8, wherein selecting the plurality of local components comprises selecting the plurality of local components according to a pattern, and further comprising automatically increasing a size of the pattern, by the computer, until a minimum number of local components satisfying a selected criterion are within the pattern.

15. A non-transitory computer-readable medium containing computer instructions stored therein for causing a computer processor to perform analysis on test data, stored in a memory accessible by the computer, for components on a wafer, wherein the instructions cause the computer to:
  select, a central component;
  select a plurality of local components in a local area near the central component;
  retrieve the test data for the selected components from the memory;
  determine a derived value of the test data for the plurality of local components;
  compare the test data for the central component to the derived value for the plurality of local components; and
  identify whether the test data for the central component represents a hybrid outlier according to the comparison of the test data for the central component to the derived value for the plurality of local components.

16. A non-transitory computer-readable medium according to claim 15, wherein the instructions further cause the computer to normalize the test data for the central component and the local components on the wafer.

17. A non-transitory computer-readable medium according to claim 16, wherein the instructions further cause the computer to compare the test data for the central component to the derived value for the plurality of test components by comparing the normalized test data for the central component to the derived value for the plurality of test components.

18. A non-transitory computer-readable medium according to claim 16, wherein the test data comprises test data generated using multi-site testing, and wherein the instructions further cause the computer to normalize the test data for the central component and the local components to counter an inconsistency induced by the multi-site testing.

19. A non-transitory computer-readable medium according to claim 15, wherein the derived value comprises an average value for the plurality of local components.

20. A non-transitory computer-readable medium according to claim 15, wherein the instructions further cause the computer to remove a global outlier from the test data before identifying whether the test data for the central component represents the hybrid outlier.

21. A non-transitory computer-readable medium according to claim 15, wherein the plurality of local components are selected according to a pattern, and wherein the instructions cause the computer to automatically increase a size of the pattern until a minimum number of local components satisfying a selected criterion are within the pattern.

* * * * *